(12) United States Patent
Ikeda et al.

(10) Patent No.: US 6,300,019 B1
(45) Date of Patent: Oct. 9, 2001

(54) PELLICLE

(75) Inventors: Shigeru Ikeda; Hiroyuki Funatsu, both of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/417,692

(22) Filed: Oct. 13, 1999

(51) Int. Cl.[7] .................................................. G03F 9/00
(52) U.S. Cl. ................................. 430/5; 430/30; 430/311
(58) Field of Search ................................. 430/5, 30, 311

(56) References Cited

U.S. PATENT DOCUMENTS

| | | | |
|---|---|---|---|
| 5,691,088 | * 11/1997 | Kubota | 430/5 |
| 5,834,143 | * 11/1998 | Matsuoka | 430/5 |
| 6,103,427 | * 8/2000 | Storm | 430/5 |
| 6,149,992 | * 11/2000 | Nakayama | 430/5 |

FOREIGN PATENT DOCUMENTS

| | | |
|---|---|---|
| 06-019124 | 1/1994 | (JP). |
| 08-194306 | 7/1996 | (JP). |
| 09-068793 | 3/1997 | (JP). |
| 10-083070 | 3/1998 | (JP). |
| 11-015140 | 1/1999 | (JP). |

\* cited by examiner

*Primary Examiner*—Christopher G. Young
(74) *Attorney, Agent, or Firm*—Jones Volentine, PLLC

(57) ABSTRACT

A pellicle is mounted onto a mask that express a wafer, by pressing the pellicle to the mask using a mounting system. The pellicle includes a pellicle membrane, and a pellicle frame including a first portion on which the pellicle membrane is attched and a second portion by which the pellicle mounting system establishes contact therewith. A distance between a surface of the first portion and the surface of the mask may be equivalent to a distance between a surface of the second portion and the surface of the mask. The second portion may have a mechanism for prevention the pellicle mounting system from slipping thereon in a direction parallel to the surface of the mask. The pellicle frame may include a contact portion that has an inclined surface that guides the pellicle mounting system to be in contact with the pellicle frame.

31 Claims, 13 Drawing Sheets

PELLICLE

BACKGROUND OF THE INVENTION

1. Field of the Invention

The present invention relates to a pellicle that prevents a particle from directly lying on a mask used for exposing a wafer, to thereby defocus the particle.

2. Description of the Related Art

Pellicles have been widely used in semiconductor manufacturing in order to reduce the influence of foreign particles when exposing wafers using a mask.

FIG. 1 shows a structure of a conventional pellicle. The pellicle principally incorporates a pellicle frame 20 and a pellicle membrane 30. A typical pellicle membrane 30 may include, for example, nitrocellulose and fluoropolymers. Because the pellicle membrane 30 has a thickness of approximate 1 micron it has very little strength to resist external forces. In addition to the pellicle frame 20 and the pellicle membrane 30, the pellicle incorporates a first adhesive 40 and a second adhesive 50. The pellicle frame 20 supports the pellicle membrane 30, wherein they are adhered to each other by the second adhesive 50. In the process of manufacturing semiconductors, a mask 10 is first prepared. The mask 10 is then cleaned and thereafter the surface of the mask 10 is inspected to detect any particles lying on the mask 10. After it has been confirmed that the surface satisfies given criteria, the pellicle is mounted onto the mask 10. Thereafter, the surface of the mask 10 is checked again. When the mask 10 is in good condition, a light source (not shown) placed at a side of the mask 10 irradiates a ray toward the mask 10, whereby a wafer (not shown) placed at another side thereof is exposed to the ray through the mask 10.

In mounting the pellicle onto the mask 10, the pellicle is pressed to the mask 10 using the pellicle mounting system 60. This pressing and the first adhesive 40 enables the pellicle to be fixed on the mask 10. The first adhesive 40 may preferably be covered with a liner (not shown) for ease of handling. Such a liner is then removed before the pellicle is mounted.

As shown in FIG. 1, pressure is applied with the contact of the pellicle membrane 30 and the pellicle mounting system 60. In other words, the pellicle mounting system 60 directly presses the pellicle membrane 30. Because the pellicle membrane 30 is thin and therefore weak to external force, this pressing may damage the pellicle membrane 30. Such damage, if severe, might cause foreign particles to invade the space surrounded by the mask 10 and the pellicle. Alternatively, the pellicle membrane 30 may peel away from the pellicle frame 20.

To detect a particle on the mask 10, a method is used wherein a light source obliquely irradiates a ray toward the mask 10 and a light detector detects a ray scattered by the particle. However, a conventional pellicle frame 20 might block a ray scattered by a particle lying near the pellicle frame 20 from reaching the detector, thereby blocking detection of such a particle.

Related to this, the size of such pellicle membranes 30 has increased and as a result, there are instances where the pellicle membrane 30 bends to its own weight. As a result, the exposure of the wafer fails, that is, the pattern on the mask 10 cannot be accurately copied to the wafer.

SUMMARY OF THE INVENTION

Therefore, it is an object of the present invention to provide a pelicle which overcomes the above issues in the related art. This object is achieved by combinations described in the independent claims. The dependent claims define further advantageous and exemplary combinations of the present invention.

According to an aspect of the present invention, there is provided a pellicle used for preventing a first particle from lying on a mask used for exposing a wafer and defocusing a second particle lying on the pellicle, the pellicle being mounted onto the mask by pressing the pellicle to the mask using a pellicle mounting system, the pellicle comprising: a pellicle membrane; and a pellicle frame including a first portion on which the pellicle membrane is attached and a second portion with which the pellicle mounting system establishes contact.

The distance between the surface of the first portion on which the pellicle membrane is attached and the surface of the mask on which the pellicle is mounted is preferably equivalent to the distance between a surface of the second portion with which the pellicle mounting system establishes contact and the surface of the mask.

A first distance between the surface of the first portion on which the pellicle membrane is attached and the surface of the mask on which the pellicle is mounted is preferably longer than a second distance between the surface of the second portion with which the pellicle mounting system establishes contact and the surface of the mask.

The second portion preferably has a mechanism for preventing the pellicle mounting system from slipping on the second portion in a direction in parallel with the surface of the mask. The mechanism preferably has a surface that resists the sliding of the pellicle mounting system.

A first distance between the surface of the first portion on which the pellicle membrane is attached and the surface of the mask on which the pellicle is mounted is preferably shorter than a second distance between the surface of the second portion with which the pellicle mounting system establishes contact and the surface of the mask.

The second distance is preferably longer than a third distance necessary for defocusing the second particle. The pellicle frame includes a contact portion that has an inclined surface and that guides the pellicle mounting system to the establishment of contact with the pellicle frame. The inclined surface is preferably directed outward. The inclined surface is directed inward.

According to another aspect of the present invention, there is provided a pellicle that prevents a particle from lying on a mask used for exposing a wafer, comprising: a pellicle membrane; a pellicle frame on which the pellicle membrane is attached; and a supporting member that prevents the pellicle membrane from bending.

The pellicle frame preferably includes a fixing mechanism that fixes the supporting member on the pellicle frame. The supporting member preferably lies under the pellicle membrane. The supporting member preferably lies over the pellicle membrane. The supporting member and the pellicle membrane are preferably adhered to each other.

The supporting member is preferably a string. The fixing mechanism preferably has a hook for fixing the string. The mechanism preferably has a defined recess for fixing the string. The fixing mechanism preferably has solder for fixing the string.

The supporting member is preferably a net. The fixing mechanism preferably uses solder to fix the net.

The pellicle frame preferably includes a thick portion thicker than other portions, wherein the supporting member is the thick portion.

According to further another aspect of the present invention, there is provided a method of detecting a particle on a mask used for exposing a semiconductor wafer, comprising: applying a ray to the mask on which a pellicle is mounted using a pellicle mounting system, the pellicle including a pellicle membrane and a pellicle frame having a first portion on which the pellicle membrane is attached and a second portion establishing contact with the pellicle mounting system, a surface of the first portion on which the pellicle membrane is attached being lower than a surface of the second portion with which the pellicle mounting system establishes contact, and being higher than the height of the pellicle membrane necessary for defocusing the particle, and receiving a scattering ray produced by the particle from the applied ray.

According to still another aspect of the present invention, there is provided a method of mounting a pellicle on a mask comprising: mounting the pellicle on the mask using a pellicle mounting system, the pellicle including a pellicle frame comprising a first contact portion having a first inclined surface, the pellicle mounting system including a second contact portion having a second inclined surface, and the first surface guiding the second surface to establishment of contact between the first contact portion and the second contact portion.

According to still another aspect of the present invention, there is provided a method of removing a pellicle from a mask comprising: removing the pellicle from the mask using a pellicle demounting system, the pellicle including a pellicle frame comprising a first contact portion having a first inclined surface, the pellicle demounting system including a second contact portion having a second inclined surface, and the first surface guiding the second surface to removal of the second contact portion from the first contact portion.

The method preferably comprises heating the mask to weaken adhesion of an adhesive between the pellicle frame and the pellicle demounting system.

According to still another aspect of the present invention, there is provided a method of exposing a wafer, comprising: applying a ray to the wafer through a mask, the mask on which a pellicle is mounted, the pellicle including a pellicle membrane; a pellicle frame on which the pellicle membrane is attached; and a supporting member that prevents the pellicle membrane from bending.

According to still another aspect of the present invention, there is provided a method of manufacturing a semiconductor device using a mask, comprising: applying a ray to the mask on which a pellicle is mounted using a pellicle mounting system, the pellicle including a pellicle membrane and a pellicle frame having a first portion on which the pellicle membrane is attached and a second portion establishing contact with the pellicle mounting system, a surface of the first portion on which the pellicle membrane is attached being lower than a surface of the second portion with which the pellicle mounting system establishes contact, and being higher than the height of the pellicle membrane necessary for defocusing the particle, and receiving a scattering ray produced by a particle lying on the mask from the applied ray.

According to still another aspect of the present invention, there is provided a method of manufacturing a semiconductor device using a wafer, comprising: applying a ray to the wafer through a mask, the mask on which a pellicle is mounted, the pellicle including a pellicle membrane; a pellicle frame on which the pellicle membrane is attached; and a supporting member that prevents the pellicle membrane from bending.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

<First Embodiment>

A first embodiment of the pellicle according to the present invention is described below.

Figure 2:
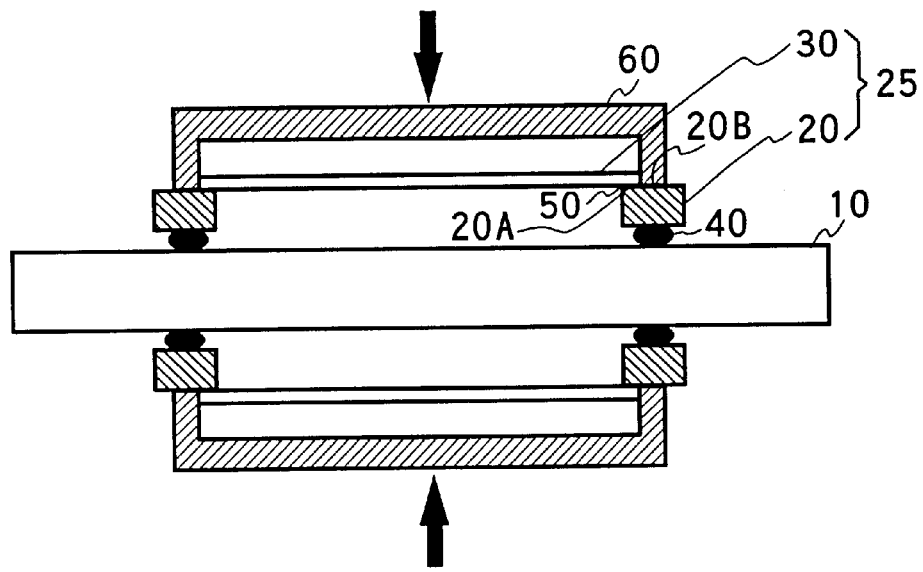
FIG. 2 shows the structure of a pellicle according to a first preferred embodiment of the present invention.

FIG. 2 shows the structure of the first embodiment. In the figure, two pellicles 25 are mounted on the mask 10. However, the number of pellicles 25 mounted on the mask 10 is not limited to two. As will be described later, a single pellicle 25 may be mounted on the mask 10. Because the configuration of the upper pellicle 25 and that of the lower pellicle 25 are the same even though their heights differ from each other, for ease of explanation and understanding, in the following only the upper pellicle 25 will be described and the description of the lower pellicle 25 will be omitted.

The pellicle 25 incorporates a pellicle frame 20 and a pellicle membrane 30. The pellicle frame 20 supports the pellicle membrane 30, wherein the pellicle frame 20 and the pellicle membrane 30 are adhered to each other by the second adhesive 50. The pellicle 25 is mounted onto the mask 10 by the pressing of the pellicle mounting system 60. More specifically, the pressing of the pellicle 25 toward the mask 10 using the pellicle mounting system 60 allows the pellicle 25 to be placed at a given position of the mask 10. The pellicle 25 further incorporates a first adhesive 40. The first adhesive 40 serves to fix the pellicle 25 on the mask 10.

The feature of the first embodiment is described below. The above pellicle frame 20 comprises a first frame portion 20A and a second frame portion 20B. The first frame portion 20A supports the pellicle membrane 30, in which the first frame portion 20A and the pellicle membrane 30 are adhered using the second adhesive 50. The second frame portion 20B is used for establishing contact with the pellicle mounting system 60. Accordingly, when pressing the pellicle 25 to the mask 10, the pellicle mounting system 60 makes contact with only the second frame portion 20B, which does not cause a damage to the pellicle membrane 30.

Figure 3A:
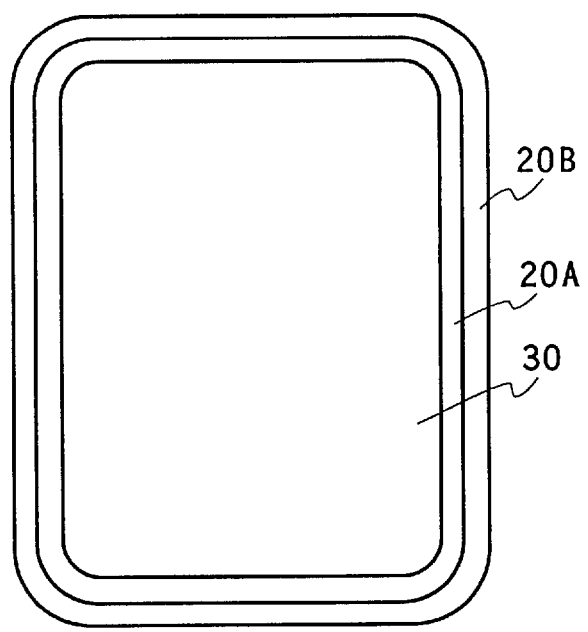
FIGS. 3A and 3B are top views of the pellicle frame of FIG.2.
Figure 3B:
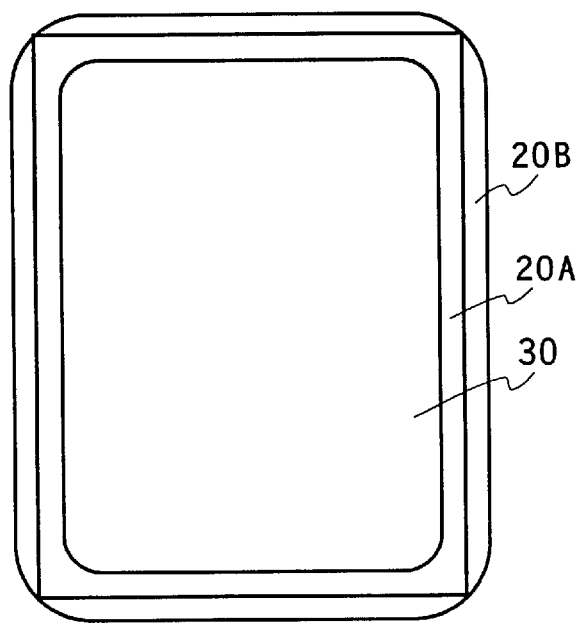

FIGS. 3A and 3B are a top views of the pellicle frame 20 of FIG. 2. In FIG. 3A the outside corners of the first frame portion 20A are rounded while in FIG. 3B the outside corners are sharpened. The sharp-corner shape is preferable in terms of ready manufacture of the pellicle frame 20 and can enable reduction of manufacturing costs and product price.

As described above, in a pellicle 25 according to the first embodiment, the pellicle frame 20 includes the first frame portion 20A that supports the pellicle membrane 30 and the second frame portion 20B that establishes contact with the pellicle mounting system 60, thereby preventing the pellicle mounting system 60 from damaging the pellicle membrane 30.

<Second Embodiment>

A second embodiment of the pellicle according to the present invention is described in the following.

Figure 4:
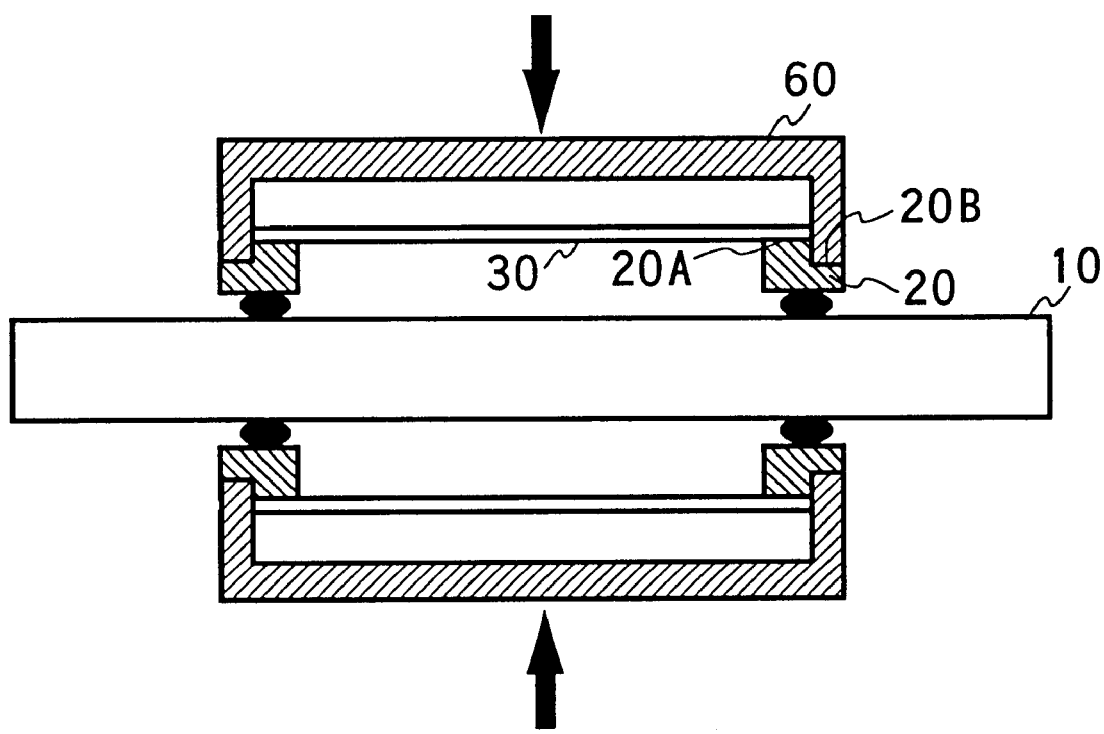
FIG. 4 shows a structure of a pellicle according to a second embodiment of the present invention.

FIG. 4 shows the structure of a pellicle according to the second embodiment. The structure of the pellicle of the second embodiment is very similar to that of the pellicle of the first embodiment while the mask 10 and the pellicle mounting system 60 in the second embodiment are the same as those in the first embodiment; therefore, only the unique features of the second embodiment will be made below for ease of description.

Similar to the pellicle of the first embodiment, the pellicle of the second embodiment incorporates the pellicle frame 20 and the pellicle membrane 30; however, the pellicle frame 20 is shaped unlike the pellicle frame 20 of the first embodiment. More specifically, this pellicle frame 20 is L-shaped, where the first frame portion 20A and the second frame portion 20B construct the pellicle frame 20. As illustrated in FIG. 4, the top surface of the first frame portion 20A is higher than that of the second frame portion 20B. The first frame portion 20A serves to support the pellicle membrane 30 while the second frame portion 20B acts to establish contact with the pellicle mounting system 60. Similar to the first embodiment, when pressing the pellicle to the mask 10, the pellicle mounting system 60 makes contact with the second frame portion 20B rather than the pellicle membrane 30 and thereby avoids damaging the pellicle membrane 30.

Since the first frame portion 20A and the second frame portion 20B are of different heights, the pellicle frame 20 includes a surface perpendicular to the mask 10 between the first and second frame portions 20A and 20B. When the pellicle is mounted onto the mask 10, this surface maintains contact with the inner surface of the pellicle mounting system 60. Accordingly, the pellicle can be set accurately at a given position on the mask 10. In other words, the shape of the pellicle frame 20 matches the shape of the tip of the pellicle mounting system 60, whereby they create no gaps in either the horizontal or the vertical directions. Thus, the pellicle can be arranged accurately at a predetermined position of the mask 10 by the pellicle mounting system 60.

As described above, similar to the first embodiment, the pellicle in accordance with the second embodiment can prevent the pellicle mounting system 60 from damaging the pellicle membrane 30 when pressing the pellicle toward the mask 10. In addition, the structure of the pellicle does not produce any gap between the pellicle and the pellicle mounting system 60, whereby the pellicle can be deposited on the mask 10.

<Third Embodiment>

A third embodiment of the pellicle according to this invention is described in the following.

Figure 5A:
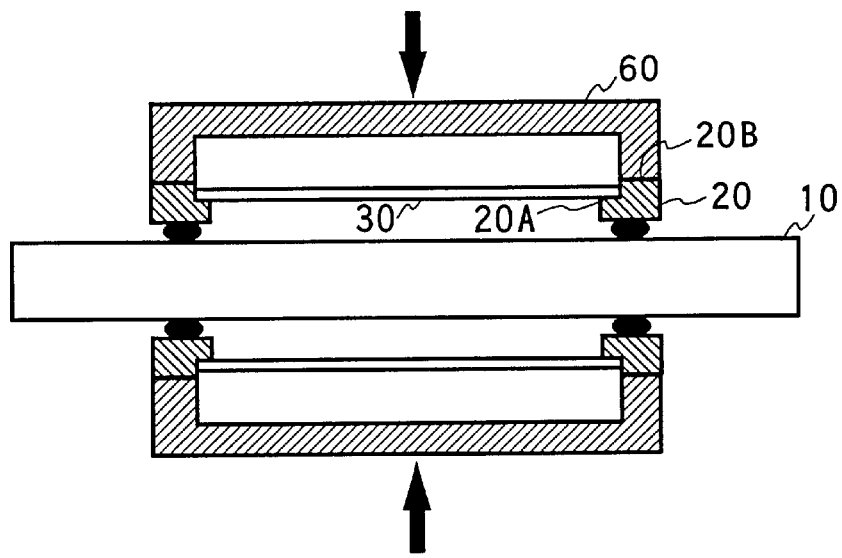
FIGS. 5A and 5B show structures of pellicles according to a third embodiment of the present invention.

FIG. 5A shows the structure of the pellicle of the third embodiment. As can be seen from this figure, this structure is extremely similar to that of the second embodiment. Therefore, the following explanation will focus upon the characteristic feature of the third embodiment.

Analogous to the first and second embodiments, the pellicle frame 20 includes a first frame portion 20A and a second frame portion 20B. The first frame portion 20A supports the pellicle membrane 30 while the second frame portion 20B makes contact with the pellicle mounting system 60. The pellicle mounting system 60 does not come in contact with the pellicle membrane 30, and therefore can not damage the pellicle membrane 30.

In comparison with the first and second embodiments, the pellicle frame 20 has a different shape. More specifically, the first portion 20A is higher than the second portion 20B in the second embodiment; on the contrary, the latter portion 20B is higher than the former portion 20A in the third embodiment. The effect of this structure will now be explained hereinafter.

Figure 1:
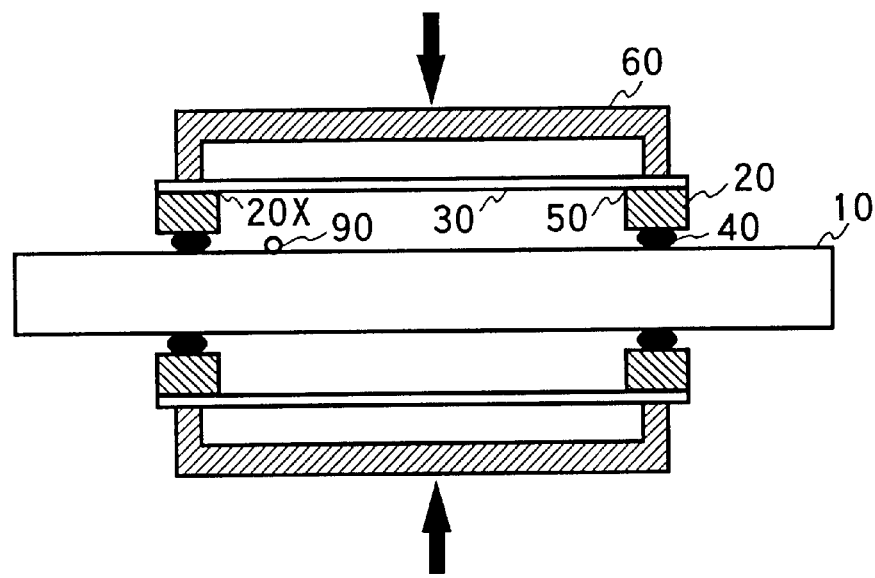
FIG. 1 shows the structure of a conventional pellicle.
Figure 5B:
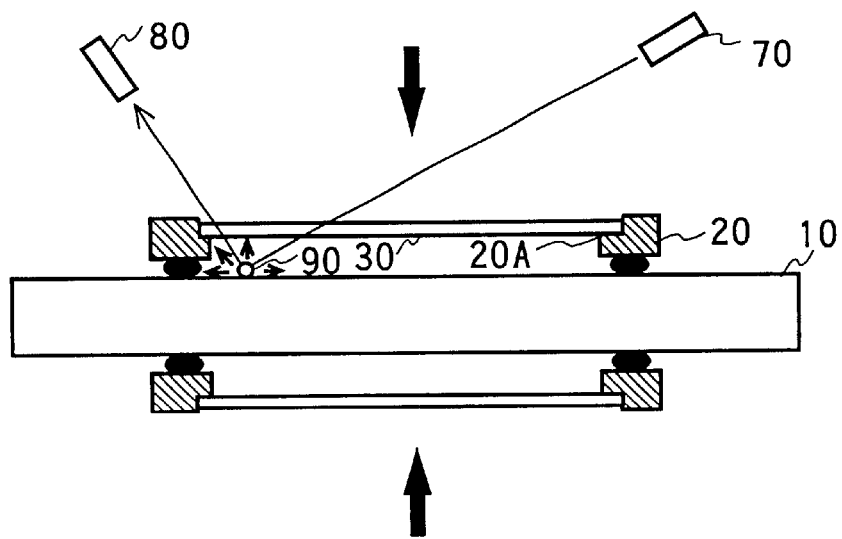

FIG. 5B shows the pellicle inspected by the particle inspection system. After the pellicle is mounted on the mask 10 using the pellicle mounting system 60, the surface of the mask 10 is inspected. To determine whether or not any particle 90 is present on the mask 10, the light source 60 irradiates a light or laser toward the mask 10 diagonally thereto so that the light detector 80 detects a laser scattered by the particle 90. However, if the particle 90 lies near the pellicle frame 20 in FIG. 1 having a corner 20X, the corner 20X obstructs the path through which the scattered laser must pass, thus failing to arrive at the light detector 80. Consequently, the particle 90 is not detected. To the contrary, since the configuration of the third embodiment does not have the corner 20X of the first embodiment, the path is not obstructed, so that the scattered ray can reach the light detector 80 even if the particle 90 exists near the pellicle frame 20. In this way, the particle 90 is detected.

As described above, with the configuration of the third embodiment, similar to the first and second embodiments, the pellicle membrane 30 is not damaged. Moreover, because the pellicle frame 20 requires no corner like corner 20X, to secure the path that the ray scattered by the particle 90 lying near the pellicle frame 20 should pass along, it ensures accurate detection of such particles 90.

<Fourth Embodiment>

A fourth embodiment of the present invention, very similar to the third, is described below. The principle difference between these two pellicles is the shape of the pellicle mounting system 60. For ease of explanation and understanding, the distinguishing feature of the fourth embodiment will be explained below.

Figure 6A:
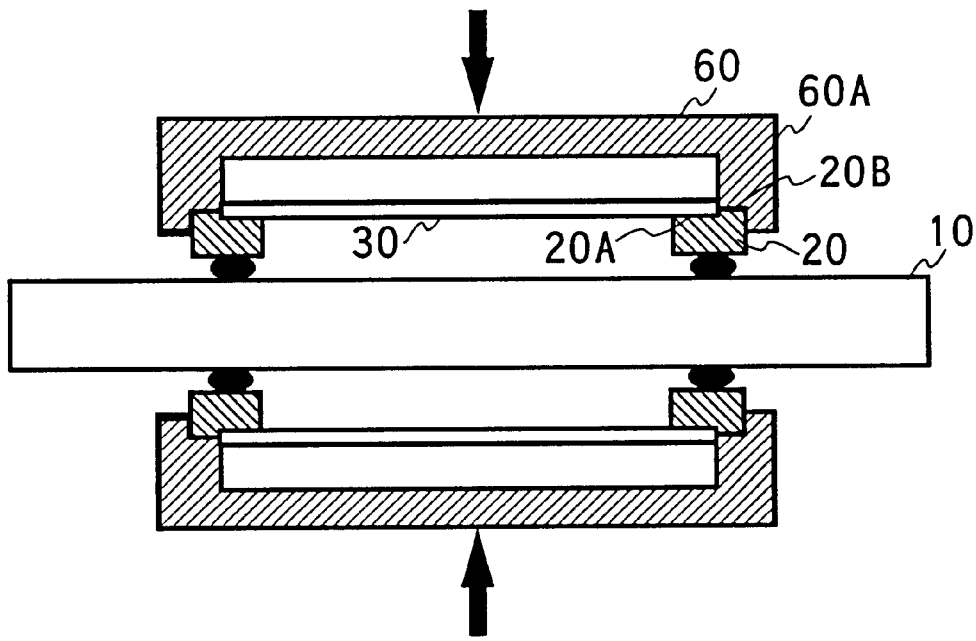
FIGS. 6A and 6B show structures of pellicles according to a fourth embodiment of the present invention.
Figure 6B:
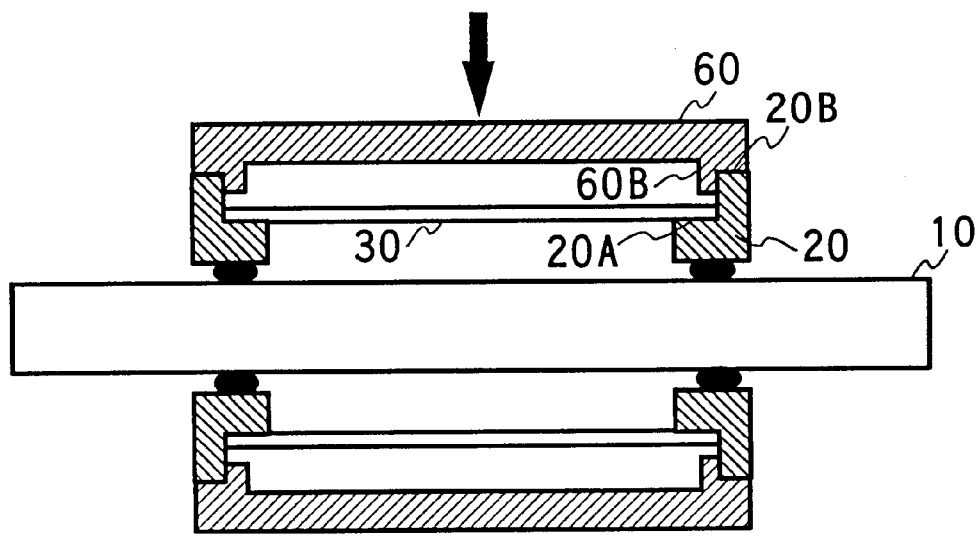

FIG. 6A shows a structure of the pellicle mounting system 60 while FIG. 6B shows another such structure. In FIGS. 6A and 6B, the pellicle mounting system 60 is so shaped as to agree with the shape of the pellicle frame 20. More specifically, in FIG. 6A, the pellicle mounting system 60 has a portion 60A for maintaining contact with the second frame portion 20B. The portion 60A ensures that there is no gap between the pellicle mounting system 60 and the pellicle frame 20, thus enabling the pellicle mounting system 60 to tightly hold the pellicle. Similarly, in FIG. 6B, the pellicle mounting system 60 further comprises a portion 60B for maintaining contact with the first frame portion 20B, where the portion 60B acts in the manner of the portion 60A.

As described above, according to the fourth embodiment, the pellicle mounting system 60 has a shape that matches that of the pellicle frame 20, whereby the pellicle mounting system 60 can press the pellicle toward the mask 10, with no resulting gap produced.

<Fifth Embodiment>

Figure 7A:
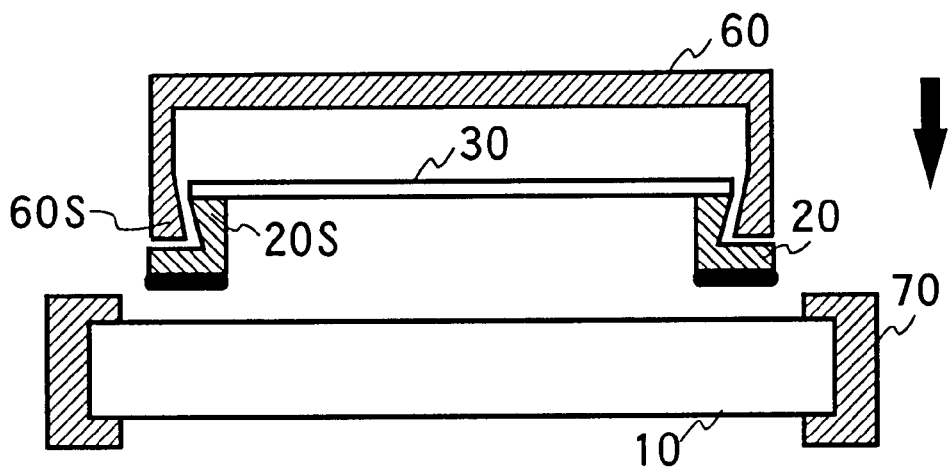
FIGS. 7A and 7B show structures of pellicles according to a fifth embodiment of the present invention.
Figure 7B:
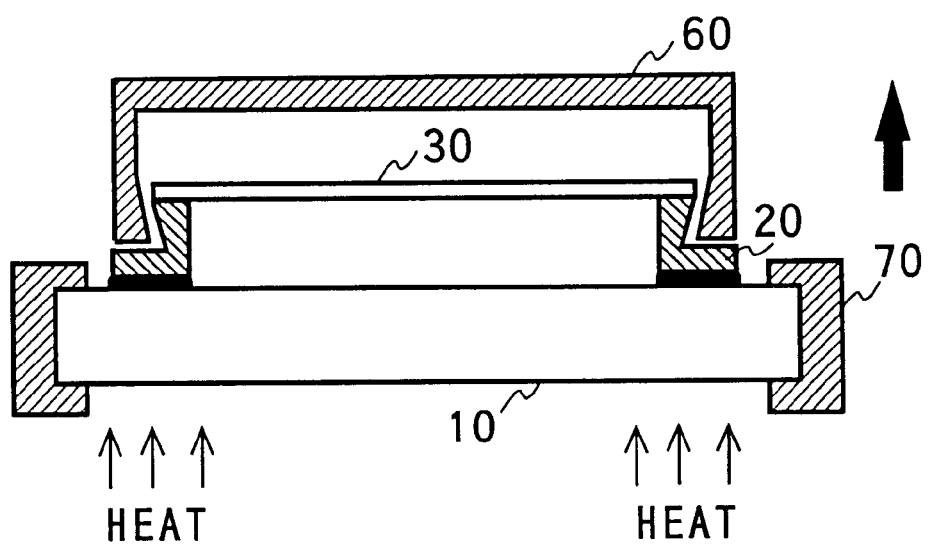

A fifth embodiment of the present invention will next be described. The distinguishing feature of the fifth embodiment is the shapes of the pellicle frame 20 and the pellicle mounting system 60. FIGS. 7A and 7B show the structure of the fifth embodiment. In FIGS. 7A and 7B, the pellicle frame 20 has contact portions 20S while the pellicle mounting system also has contact portions 60S. Here, the pellicle mounting system 60 serves to mount the pellicle on the mask 10, and serves to demount or remove the pellicle from the mask 10. Therefore, the system 60 may be referred to as the pellicle mounting system 60, the pellicle demounting system 60, or the pellicle mounting/demounting system 60 in the following explanation. The contact portions 20S are inclined and the contact portions 60S are also inclined, wherein they face to each other. The mask 10 on which the pellicle should be mounted is fixed by the mask fixing members 70. The other elements are the same as those of the above described embodiments.

Figure 8:
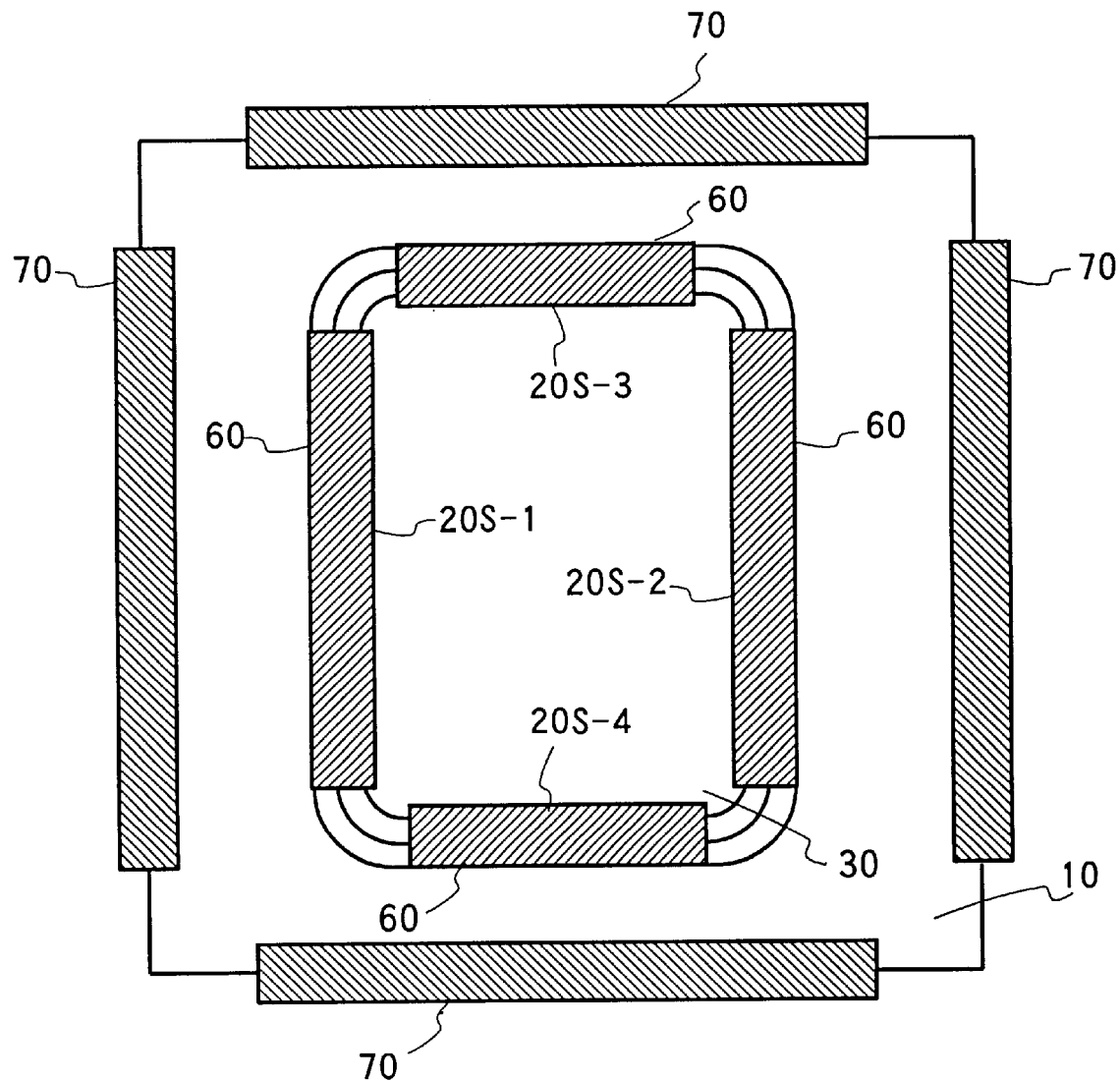
FIG. 8 is a top view of the pellicle according to the fifth embodiment of the present invention.

FIG. 8 is a top view of the apparatus shown in FIGS. 7A and 7B. In the figure, the pellicle is supported by the pellicle mounting system 60 on all sides. In other words, all of the contact portions 20S establish contact with the respective contact portions 60S.

In the configuration shown in FIG. 7A and FIG. 8, in order to seize the pellicle, the pellicle mounting system 60 is moved toward the height of the contact portions 20S vertically so that the contact portions 60S face to the respective contact portions 20S, that is to say, so that the contact portions 60S surrounds the contact portions 20S. Next, the contact portions 60S approaches the respective contact portion 20S horizontally, whereby the pellicle mounting system 60 seizes the pellicle frame 20. As both the contact portions 60S and the contact portions 20S are sloped, they readily establish contact with each other. Stated another way, the pellicle mounting system 60 readily grasps the pellicle frame 20.

As described above, because the pellicle frame 20 has contact portions 20S and the pellicle mounting/demounting system 60 has contact portions 60S, the pellicle mounting/demounting system 60 can readily seize the pellicle frame 20. More specifically, the shapes of the contact portions 60S and the contact portions 20S enable the pellicle mounting/demounting system 60 and the contact portion 20 to easily establish contact with each other. Therefore, the accuracy in the movement of the pellicle mounting/demounting system 60 is not required to the extent of the prior art. In other words, the pellicle mounting/demounting system 60 of this embodiment is permitted to move or slide more roughly compared with the prior art, which can reduce the cost of manufacturing the semiconductor devices.

In FIG. 7B, to remove the pellicle from the mask 10, the pellicle demounting system 60 seizes the pellicle frame 20 as outline above. Next, the pellicle demounting system 60 lifts up the pellicle while the mask 10 remains at the same position.

As described above, because the pellicle demounting system 60 lifts up the pellicle by maintaining contact with all the sides of pellicle frame 20, the removal force of the pellicle demounting system 60 is uniformly applied to the pellicle frame 20, whereby the pellicle is readily removed from the mask 10. In addition, as shown in FIG. 7B, heating the adhesive by which the pellicle frame 20 and the mask 10 are adhered with each other enables removing the mask 10 with less force.

<Sixth Embodiment>

A sixth embodiment of the present invention is described below.

Figure 9A:
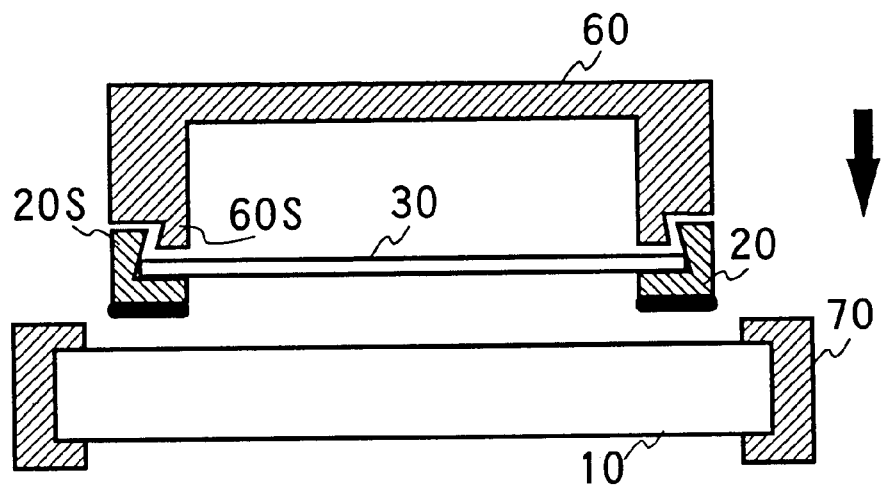
FIGS. 9A and 9B show structures of pellicles according to a sixth embodiment of the present invention.
Figure 9B:
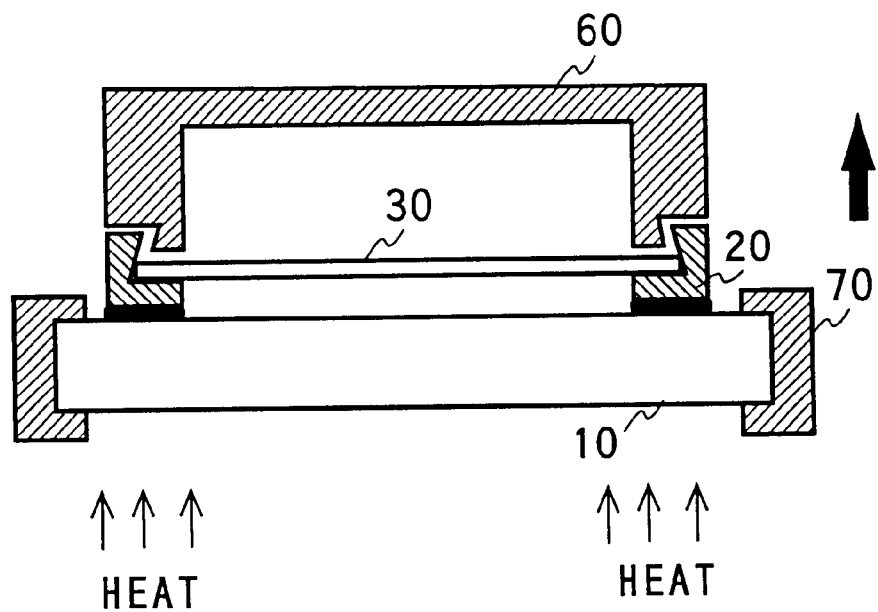

FIGS. 9A and 9B show the structure of the sixth embodiment. Similar to the pellicle mounting/demounting system 60 in the fifth embodiment, this pellicle mounting/demounting system 60 is vertically moved toward the pellicle and is horizontally moved to seize the pellicle, thus mounting the pellicle onto the mask 10. In addition, Similar to the fifth embodiment, the pellicle frame 20 and the pellicle mounting/demounting system 60 have contact portions 20S and contact portions 60S, respectively. However, the relationship between the contact portion 20S and the contact portions 60S in this embodiment is inverse to that of the fifth embodiment. That is to say, the pellicle mounting/demounting system 60 in the fifth embodiment seizes the pellicle from the outside of the pellicle while the pellicle mounting/demounting system 60 in the sixth embodiment seizes the pellicle from the inside of the pellicle.

In the configuration shown in FIG. 9A, similar to that of FIG. 7A, when mounting the pellicle on the mask 10, the pellicle mounting system 60 is moved so that the contact portions 60S are closer to the contact portions 20S. Subsequently, the contact portions 60S are slid on the corresponding contact portions 20S while the height of the pellicle mounting system 60 is kept almost unchanged, thus allowing the contact portions 60S and the contact portions 20S to establish contact with each other. As a result, the pellicle mounting system 60 can securely seize the pellicle. Maintaining this seizure, the pellicle mounting system 60 mounts the pellicle on the mask 10.

In the apparatus of FIG. 9B, similar to that of the fifth embodiment, when removing the pellicle from the mask 10, first the pellicle demounting system 60 seizes the pellicle. Next, the pellicle demounting system 60 lifts up and removes the pellicle from the mask 10. Analogously to FIG. 7B, heating the adhesive serving between the pellicle and the mask 10 eases removal of the pellicle from the mask 10 because the adhesion force of the adhesive is weakened.

As described above, in accordance with the sixth embodiment, the contact portions 20S of the pellicle frame 20 and the contact portions 60S of the pellicle mounting/demounting system can give the same effect as that of the fifth embodiment.

<Seventh Embodiment>

A seventh embodiment of the pellicle according to the present invention is described below.

Figure 10A:
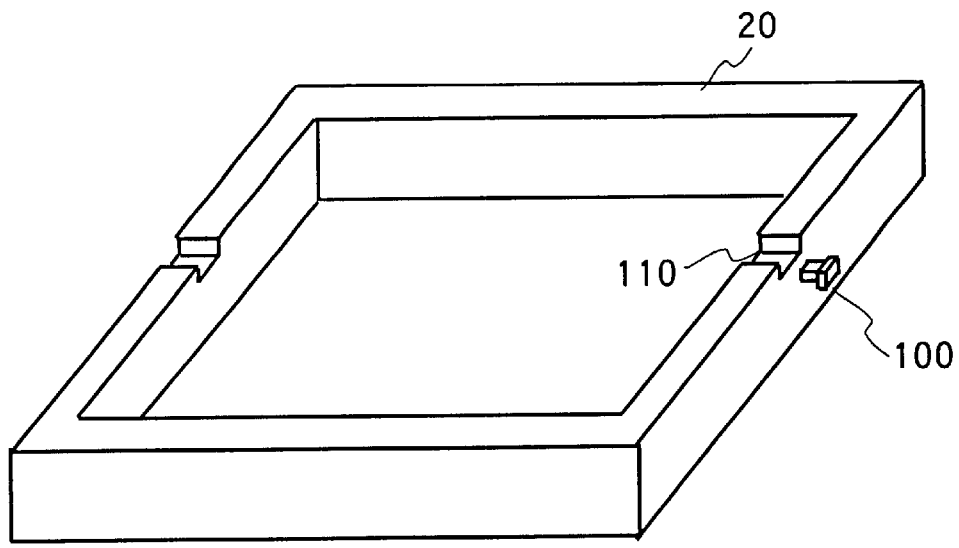
FIGS. 10A–10C show the structure of a pellicle according to a seventh embodiment of the present invention.

FIG. 10A is a perspective view showing the pellicle frame of the seventh embodiment. In FIG. 10A, the pellicle frame 20 has two hooks 100 paired with two respective recesses. One pair is made on a side surface of the pellicle frame 20, while the other pair is made on the side surface opposite to the above side surface. These hooks 100 and recesses are used for holding a string 120 that supports the pellicle membrane 30, as detailed below.

Figure 10B:
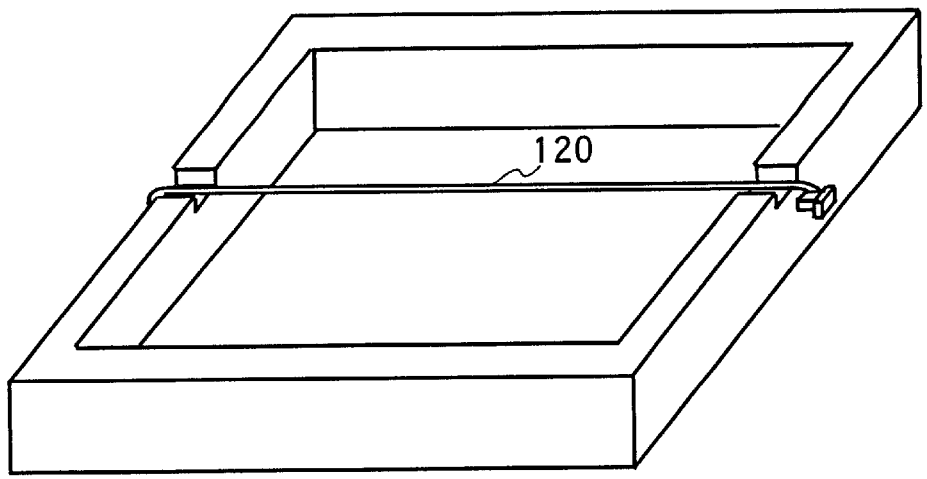

FIG. 10B is a perspective view showing the pellicle frame 20 holding the string 120. In the figure, both the ends of the strings 120 are fixed at the respective hooks 100, and are specifically tied into the hooks 100, wherein the string 120 is stretched over the pellicle frame 20 through the recesses 110. From the viewpoint of the influence upon exposure of the wafer, the string 120 preferably has a width of less than 50 microns, while the number of strings 120 is not limited to one; a plurality of strings 120 may be employed.

Figure 10C:
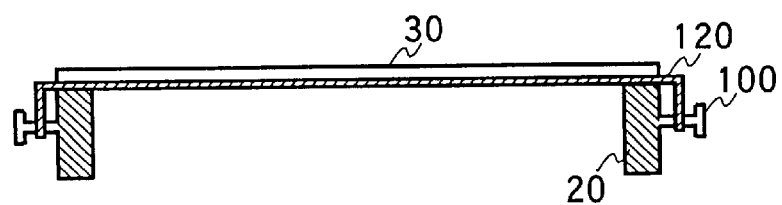

FIG. 10C is a cross sectional view showing the complete structure of a pellicle covered with the pellicle membrane 30. In FIG. 10C, on the string 120 lies the pellicle membrane 30. The pellicle membrane 30 is prone to bend due to its weight, but the string 120 resists the bending of the pellicle membrane 120, and thereby maintains the shape of the pellicle membrane 120.

As described above, in accordance with the seventh embodiment, the string 120 is arranged over the pellicle frame 20 to support the pellicle membrane 30, thereby preventing the pellicle membrane 30 from bending downward due to its weight. As the desire to employ larger pellicle membranes 30 has sharply increased, the advantage offered by this embodiment can meet that demand.

<Eighth Embodiment>

An eighth embodiment of the pellicle in accordance with this invention is explained below.

Figure 11A:
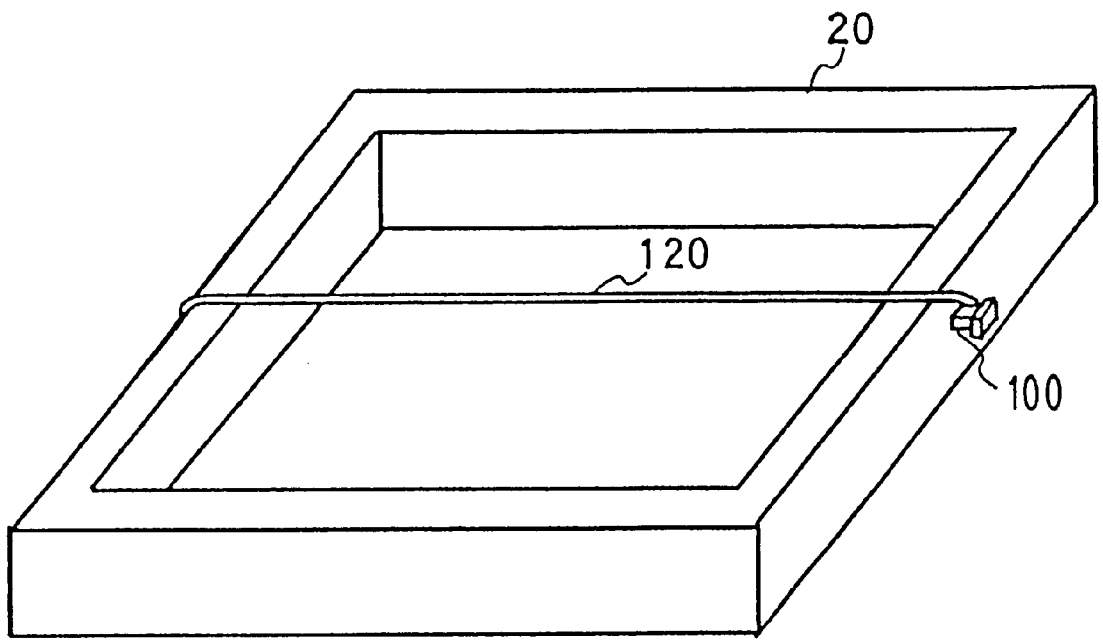
FIGS. 11A and 11B show the structure of a pellicle according to an eighth embodiment of the present invention.

FIG. 11A is a perspective view of the pellicle frame 20 of the eighth embodiment. Whereas the pellicle frame 20 of the seventh embodiment comprises recesses 110, the pellicle frame 20 of this embodiment has no recesses. Accordingly, similar to the seventh embodiment, the string 120 is stretched over the pellicle frame 20, but without assistance of recesses.

Figure 11B:
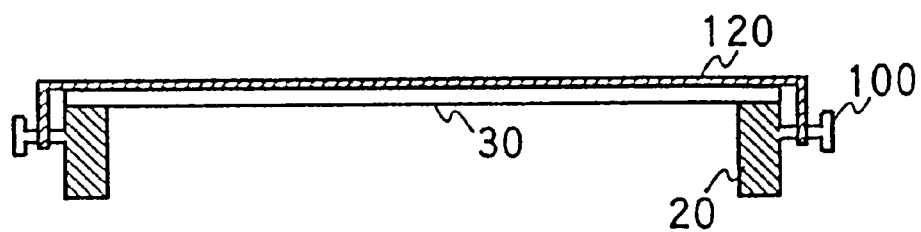

FIG. 11B is a cross sectional view showing the eighth embodiment of the pellicle frame 20. In the figure, in contrast with the seventh embodiment, the string 120 lies on the pellicle membrane 30, being adhered thereto with an adhesive. In this way, the string 120 supports the pellicle membrane 30.

As described above, according to the eighth embodiment, the string 120 arranged over the pellicle frame 20 supports the pellicle membrane 30, thus preventing the pellicle membrane 30 from bending due to its own weight.

<Ninth Embodiment>

Hereinafter, a ninth embodiment of the pellicle according to the present invention is described in detail. As explained above, the pellicle frame 20 of the seventh and eighth embodiments comprises both hooks 100 and recesses 110. To the contrary, the structure of the pellicle frame 20 of the ninth embodiment is simplified to comprise neither hooks nor recesses.

Figure 12A:
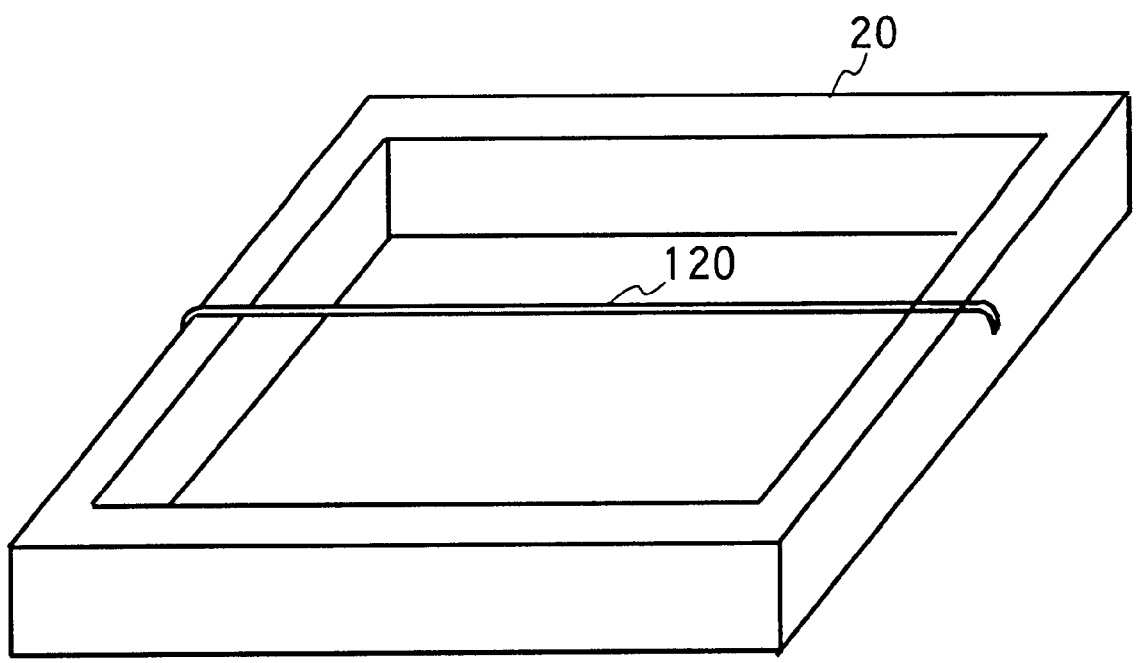
FIGS. 12A and 12B show the structure of a pellicle according to a ninth embodiment of the present invention.
Figure 12B:
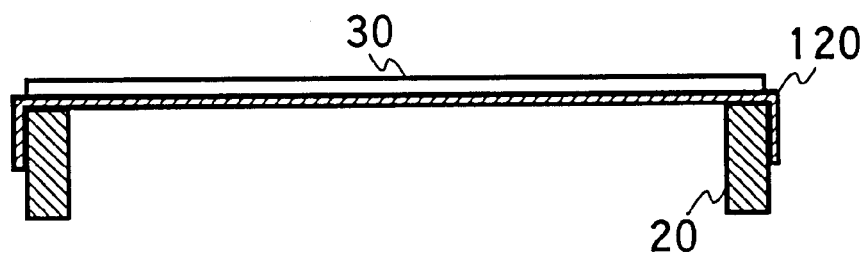

FIG. 12A is a perspective view showing the pellicle frame 20 of the ninth embodiment, and FIG. 12B is a cross sectional view of the pellicle. In FIG. 12A, the ends of the string 120 are soldered on the pellicle frame 20, wherein the string 120 is stretched over the pellicle frame 20. In FIG. 12B, the pellicle membrane 30 lies on, and this is supported by, the string 120.

As described above, in accordance with the ninth embodiment, similar to the preceding embodiment, the string 120 stretching over the pellicle frame 20 can prevent the pellicle membrane 30 from bending under its own weight. In addition, the string is directly fixed on the pellicle frame 20 using only the solder, which simplifies the structure of the pellicle in comparison with those embodiments.

<Tenth Embodiment>

A tenth embodiment of the pellicle according to the present invention is described below.

Figure 13A:
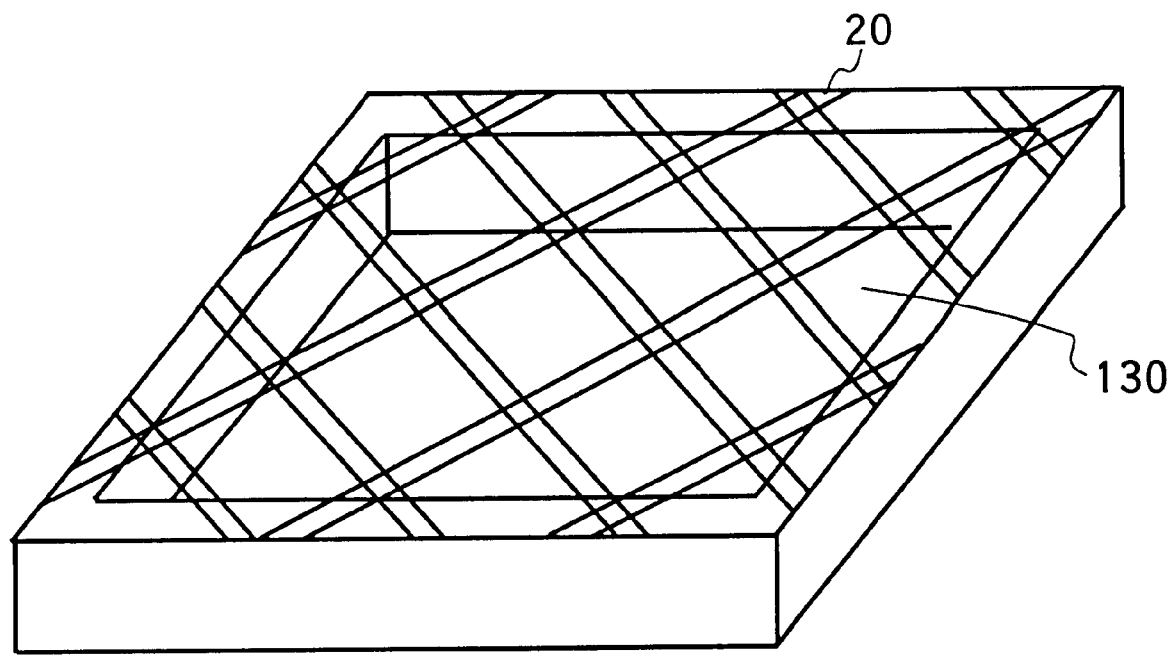
FIGS. 13A and 13B show the structure of a pellicle according to a tenth embodiment of the present invention.
Figure 13B:
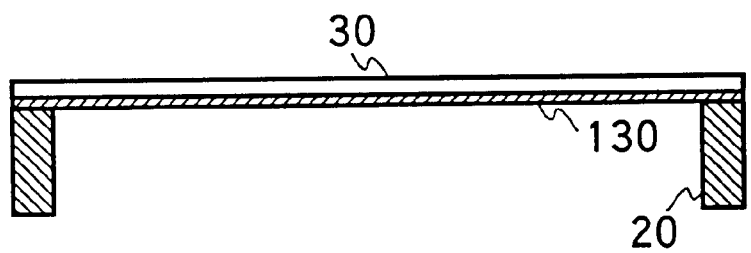

FIG. 13A is a perspective view of the tenth embodiment of the pellicle, and FIG. 13B is a cross sectional view thereof. Whereas the pellicle of the previous embodiments employ the string 120 to support the pellicle membrane 30, the pellicle of this embodiment employs a net 130 in lieu of the string 120 of the ninth embodiment, as shown in FIG. 13A. This net 130 is directly attached on the pellicle frame 20 using solder or the like. Like the string 120, the width of the net 130 is preferably smaller than 50 microns.

In FIG. 13B, the pellicle membrane 30 lies on, and is supported by the net 130.

As described above, in accordance with the tenth embodiment, the net 130 is deposited on the pellicle frame 20 to thereby prevent the pellicle membrane 30 from bending due to its weight.

<Eleventh Embodiment>

An eleventh embodiment of the pellicle according to the present invention is explained below.

Figure 14A:
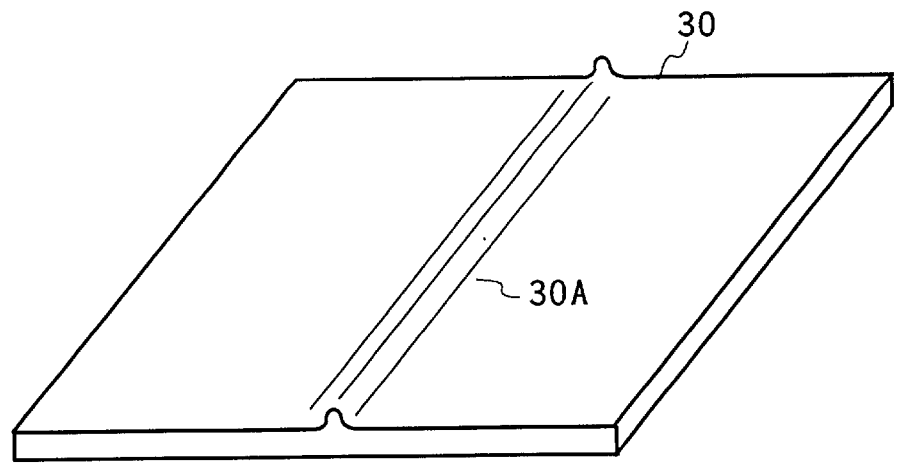
FIGS. 14A–14C show the structure of a pellicle according to an eleventh embodiment of the present invention.
Figure 14B:
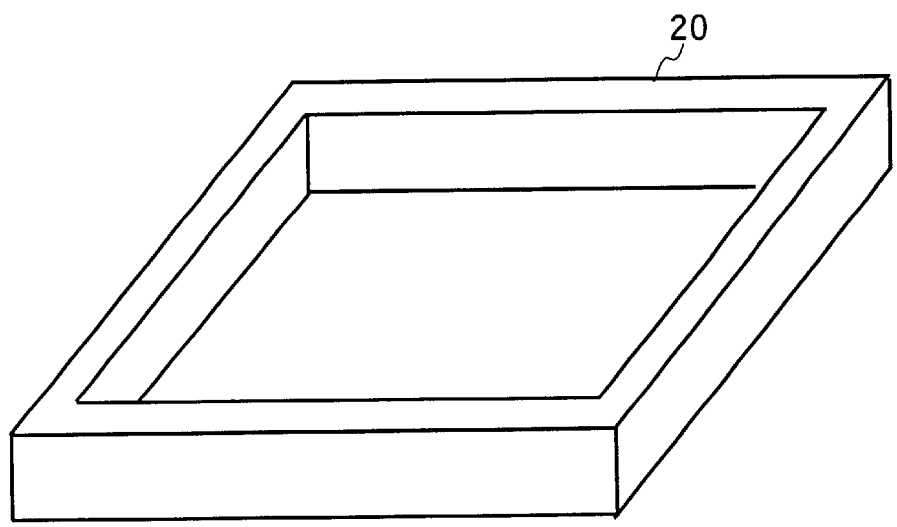
Figure 14C:
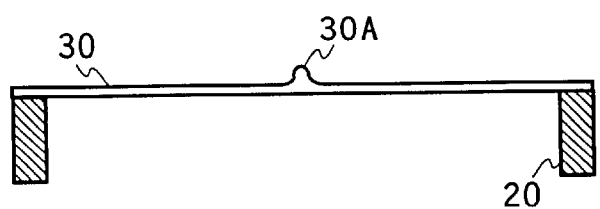

FIG. 14A is a perspective view of the pellicle membrane, FIG. 14B is a perspective view of the pellicle frame, and FIG. 14C is a cross sectional of the pellicle.

While the pellicle membranes 30 of the preceding embodiments are flat, the pellicle membrane 30 of the eleventh embodiment has a thick portion 30A. The portion 30A serves to support the pellicle membrane 30 itself, which characterizes this embodiment. Other elements including the pellicle frame 20 shown in FIG. 14B are the same as those in the previous embodiments.

In FIG. 14C, the membrane 30 is attached on the pellicle frame 20, wherein the portion 30A stretches over the pellicle frame 20. Since the thickness of the portion 30A is larger than those of other portions, the portion 30A resists the bending force produced by the weight of the pellicle membrane 30. Therefore, according to this embodiment, the thick portion 30A provided in the pellicle membrane 30 supports the pellicle membrane 30 itself. Thus, the pellicle membrane 30 does not bend downward due to its own weight.

Although the present invention has been described by way of exemplary embodiments, it should be understood that many changes and substitutions may be made by those skilled in the art without departing from the spirit and the scope of the present invention which is defined only by the appended claims.

What is claimed is:

1. A pellicle used for preventing a first particle from lying on a mask used for exposing a wafer and defocusing a second particle lying on said pellicle, said pellicle being mounted onto said mask by pressing said pellicle to said mask using a pellicle mounting system, said pellicle comprising:

a pellicle membrane; and a pellicle frame including a first portion on which said pellicle membrane is attached and a second portion with which said pellicle mounting system establishes contact.

2. A pellicle as set forth in claim 1, wherein a distance between a surface of said first portion on which said pellicle membrane is attached and a surface of said mask on which said pellicle is mounted is equivalent to a distance between a surface of said second portion with which said pellicle mounting system establishes contact and said surface of said mask.

3. A pellicle as set forth in claim 1, wherein a first distance between a surface of said first portion on which said pellicle membrane is attached and a surface of said mask on which said pellicle is mounted is longer than a second distance between a surface of said second portion with which said pellicle mounting system establishes contact and said surface of said mask.

4. A pellicle as set forth in claim 1, wherein
said pellicle frame has a mechanism preventing said pellicle mounting system from slipping on said second portion in a direction parallel with a surface of said mask.

5. A pellicle as set forth in claim 4, wherein
said mechanism has a surface that resists slipping of said pellicle mounting system.

6. A pellicle as set forth in claim 1, wherein
a first distance between a surface of said first portion on which said pellicle membrane is attached and a surface of said mask on which said pellicle is mounted is shorter than a second distance between a surface of said second portion with which said pellicle mounting system establishes contact and said surface of said mask.

7. A pellicle as set forth in claim 6, wherein
said second distance is longer than a third distance necessary for defocusing said second particle.

8. A pellicle as set forth in claim 1, wherein
said pellicle frame includes a contact portion that has an inclined surface and that guides said pellicle mounting system to said establishment of contact with said pellicle frame.

9. A pellicle as set forth in claim 8, wherein
said inclined surface is directed outward.

10. A pellicle as set forth in claim 8, wherein
said inclined surface is directed inward.

11. A pellicle according to claim 1, wherein said second portion of said pellicle frame has at least a contact surface positioned outward of said first portion of said pellicle frame and which faces a direction opposing said mask.

12. A pellicle that prevents a particle from lying on a mask used for exposing a wafer, comprising:
 a pellicle membrane;
 a pellicle frame on which said pellicle membrane is attached; and
 a supporting member that prevents said pellicle membrane from bending.

13. A pellicle as set forth in claim 12, wherein
said pellicle frame includes a fixing mechanism that fixes said supporting member on said pellicle frame.

14. A pellicle as set forth in claim 12, wherein
said supporting member lies under said pellicle membrane.

15. A pellicle as set forth in claim 12, wherein
said supporting member lies over said pellicle membrane.

16. A pellicle as set forth in claim 12, wherein
said supporting member and said pellicle membrane are adhered to each other.

17. A pellicle as set forth in claim 12, wherein
said supporting member is a string.

18. A pellicle as set forth in claim 17, wherein said pellicle frame includes a fixing mechanism that fixes said supporting member on said pellicle frame,
 said fixing mechanism having a hook for fixing said string.

19. A pellicle as set forth in claim 18, wherein
said fixing mechanism has a defined recess for fixing said string.

20. A pellicle as set forth in claim 17, wherein
said fixing mechanism has solder for fixing said string.

21. A pellicle as set forth in claim 12, wherein
said supporting member is a net.

22. A pellicle as set forth in claim 21, wherein
said fixing mechanism uses solder to fix said net.

23. A pellicle according to claim 12, wherein said supporting member lies inside said pellicle frame in a direction of said pellicle membrane.

24. A pellicle as set forth in claim 12, wherein
said pellicle membrane includes a thick portion thicker than other portions thereof,
wherein said supporting membrane is said thick portion.

25. A method of detecting a particle on a mask used for exposing a semiconductor wafer, comprising:
 applying a ray to the mask on which pellicle is mounted using a pellicle mounting system, said pellicle including a pellicle membrane and a pellicle frame having a first portion on which said pellicle membrane is attached and a second portion establishing contact with said pellicle mounting system, a surface of said first portion on which said pellicle membrane is attached being lower than a surface of said second portion with which said pellicle mounting system establishes contact, and being higher than a position of said pellicle membrane necessary for defocusing a particle lying on said pellicle, and
 receiving a scattering ray produced by said applied ray scattering off a particle lying on said mask.

26. A method of mounting a pellicle on a mask comprising:
 mounting said pellicle on said mask using a pellicle mounting system, said pellicle including a pellicle frame comprising a first contact portion having a first inclined surface, the pellicle mounting system including a second contact portion having a second inclined surface, and said first inclined surface guiding said second inclined surface to establishment of contact between said first contact portion and said second contact portion.

27. A method of removing a pellicle from a mask comprising:
 removing said pellicle from said mask using a pellicle demounting system, said pellicle including a pellicle frame comprising a first contact portion having a first inclined surface, the pellicle demounting system including a second contact portion having a second inclined surface, and said first inclined surface guiding said second inclined surface to removal of said second contact portion from said first contact portion.

28. A method as set forth in claim 27, further comprising:
 heating said mask to weaken adhesion of an adhesive between said pellicle frame and said pellicle demounting system.

29. A method of exposing a wafer, comprising:
 applying a ray to said wafer through a mask, a pellicle being mounted on said mask,
 said pellicle including a pellicle membrane, a pellicle frame on which said pellicle membrane is attached, and a supporting membrane that prevents said pellicle membrane from bending.

30. A method of manufacturing a semiconductor device using a mask, comprising:

applying a ray to the mask on which a pellicle is mounted using a pellicle mounting system, said pellicle including a pellicle membrane and a pellicle frame having a first portion on which said pellicle membrane is attached and a second portion establishing contact with said pellicle mounting system, a surface of said first portion on which said pellicle membrane is attached being lower than a surface of said second portion with which said pellicle mounting system establishes contact, and being higher than a height of said pellicle membrane necessary for defocusing a particle lying on said pellicle, and receiving a scattering ray produced by said applied ray scattering off a particle lying on said mask.

31. A method of manufacturing a semiconductor device using a wafer, comprising:

applying a ray to said wafer through a mask, a pellicle being mounted on said mask, said pellicle including a pellicle membrane, a pellicle frame on which said pellicle membrane is attached, and a supporting member that prevents said pellicle membrane from bending.

* * * * *